| United States Patent [19] | [11] Patent Number: 4,831,063 |
|---|---|
| Suzuki et al. | [45] Date of Patent: May 16, 1989 |

[54] PHOTOCURABLE COMPOSITION

[75] Inventors: Shuichi Suzuki, Yokohama; Moriyasu Wada, Ninomiya; Shuzi Hayase, Kawasaki, all of Japan

[73] Assignee: Kabushiki Kaisha Toshiba, Kawasaki, Japan

[21] Appl. No.: 18,834

[22] Filed: Feb. 24, 1987

Related U.S. Application Data

[63] Continuation of Ser. No. 648,366, Sep. 7, 1984, abandoned.

[30] Foreign Application Priority Data

Sep. 29, 1983 [JP] Japan ................................ 58-179359

[51] Int. Cl.$^4$ .......................... C08F 2/50; C08F 4/14; C08F 4/58; C08L 63/10
[52] U.S. Cl. ......................................... 522/13; 522/8; 522/12; 522/18; 522/24; 522/39; 522/100; 522/103; 522/170; 525/922; 526/268; 526/273; 503/226; 428/913
[58] Field of Search ....................... 522/170, 8, 13, 12, 522/18, 24

[56] References Cited

U.S. PATENT DOCUMENTS 3,708,296 1/1973 Schlesinger ............................ 96/33
3,971,747 7/1976 Bank et al. ............................ 260/37
4,081,276 3/1978 Crivello ................................ 96/35.1
4,368,300 1/1983 Nakano et al. ....................... 525/531
4,406,764 9/1983 Hayase et al. .................. 204/159.11
4,479,860 10/1984 Hayase et al. ....................... 204/159
4,495,042 1/1985 Hayase et al. .................. 204/159.14

OTHER PUBLICATIONS

Crivello, J. V., Lam, J. H. W., Photoinitiated Cationic Polymerization by Dialkylphenacylsulfonium Salts, 17 J. Polymer Sci. 2887 (1979).

*Primary Examiner*—Lewis T. Jacobs
*Assistant Examiner*—Arthur H. Koeckert
*Attorney, Agent, or Firm*—Foley & Lardner, Schwartz, Jeffery, Schwaab, Mack, Blumenthal & Evans

[57] ABSTRACT

A photocurable composition comprising (1) an epoxy compound having at least one epoxy group and at least one unsaturated double bond in the same molecule; (2) a metal compound present in an amount ranging from 0.001 to 10 wt. %, based on the epoxy compound; and (3) a silicon compound which is capable of forming a silanol group when irradiated with light and which is present in an amount ranging from 0.1 to 20 wt. %, based on the epoxy compound, is characterized by a particularly rapid curing rate.

12 Claims, No Drawings

PHOTOCURABLE COMPOSITION

This application is a continuation of application Ser. No. 648,366, filed Sept. 7, 1984, now abandoned.

BACKGROUND OF THE INVENTION

This invention relates to a novel photocurable composition, more particularly to a photocurable composition which can be cured by irradiation of light within a short time and is suitable for use as ink, paint, adhesive, surface coating material, plate-making material, sealant, electric insulating material, etc.

In recent years, in connection with conservation of energy or workability, processes to cure resins by irradiation of light are coming to the fore of interest. Among them, the process to photocure an epoxy resin can be widely applied and is important. The processes to be used for photocuring of epoxy resins can be classified into the two types.

One is a composition obtained by modification of an epoxy resin with use of a vinyl group-containing compound such as an acrylic ester having a photopolymerizability, which undergoes photopolymerization through the vinyl group. However, the epoxy resin modified with the vinyl group-containing compound is considerably inferior in the adhesion property and the heat resisting property to an unmodified epoxy resin itself.

The other is a composition obtained by curing the epoxy resin itself by use of a catalyst of a photodecomposable type. An example of the catalyst used therefor is a complex represented by the following formula:

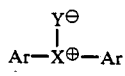

(wherein Ar represents an aromatic group such as a phenyl group; X represents an iodine atom, a sulfur atom, a diazo group, or the like; and Y represents $BF_4$, $PF_6$, $AsF_6$, $SbF_6$ or the like), as disclosed in Macromoleculas, 10, 1307 (1977); Journal of Radiation Curing, 5, 2 (1978); Journal of Polymer Science Polymer Chemistry Edition, 17, 2877 (1979); ditto, 17, 1047 (1979); Journal of Polymer Science Polymer Letters Edition 17, 759 (1979); Specification of Japanese Unexamined Patent Publication (KOKAI) No. 65219/1980; specification of U.S. Pat. No. 4,069,054; specification of British Pat. No. 1,516,511; specification of British Pat. No. 1,518,141; etc.

However, the cured resin products obtained by use of these catalysts, while having good mechanical characteristics and heat resistance, inconveniences are involved such that the characteristics may be deteriorated or corrosion phenomenon may be caused by heating or with lapse of time on account of the catalytic component which is a strong acid and becomes ionic impurity, and at the same time great problems remain with repect to workability and handling.

The present inventors have already proposed a photocurable composition comprising an epoxy resin which is photocurable by use of a catalyst comprising an aluminum compound and an α-ketosilyl compound (Japanese Unexamined Patent Publication No. 125212/1982). This composition, which can overcome almost the problems as mentioned above, was not satisfactory with respect to curing speed.

SUMMARY OF THE INVENTION

This invention has been accomplished in order to cancel the problems of the prior art as described above and an object of this invention is to provide an epoxy resin type photocurable composition which is good in photocuring speed and also excellent in mechanical, physical and electrical characteristics of the cured product obtained.

The photocurable composition of this invention comprises:

an epoxy compound having at least one epoxy group and at least one unsaturated double bond at the same time in the molecule;

a metal compound to be formulated in an amount ranging from 0.001 to 10 wt. % based on the epoxy compound; and a silicon compound capable of forming a silanol group by irradiation of light and formulated in an amount ranging from 0.1 to 20 wt. % based on the epoxy compound.

The above object of this invention can be accomplished by combination of these components. In particulr, by use of an epoxy compound having an unsaturated double bonding, the curing speed and tack-free time can be improved to great extent.

DESCRIPTION OF THE PREFERRED EMBODIMENTS

The epoxy compound to be used in the prsent invention has epoxy group and unsaturated double bond in the molecule. The number of epoxy groups and unsaturated double bonds existing in one molecule may be at least one, each being preferably within the range from 2 to 5.

Examples of epoxy groups include the following:

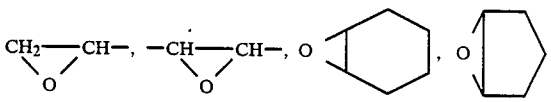

The groups having unsaturated double bonds may be exemplified by the following groups:

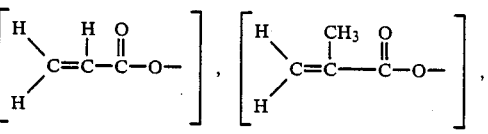

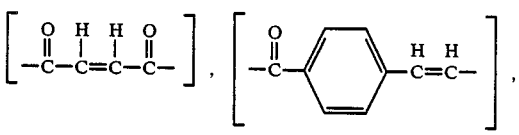

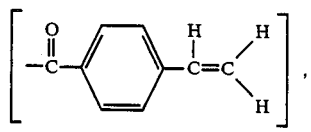

-continued

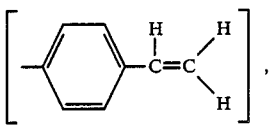

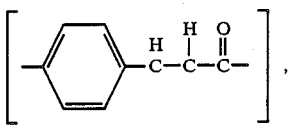

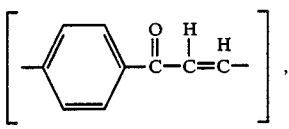

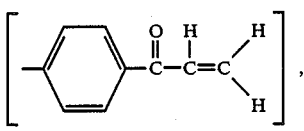

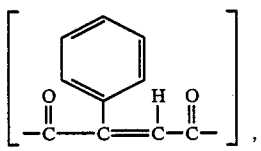

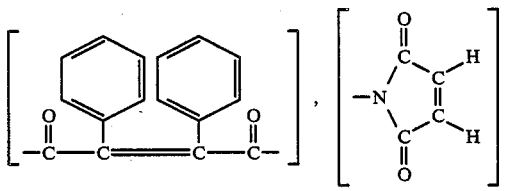

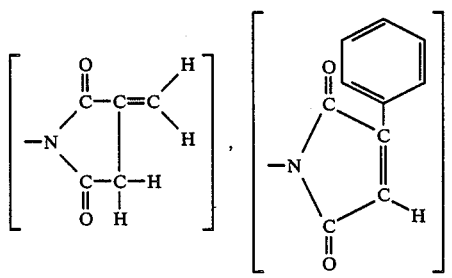

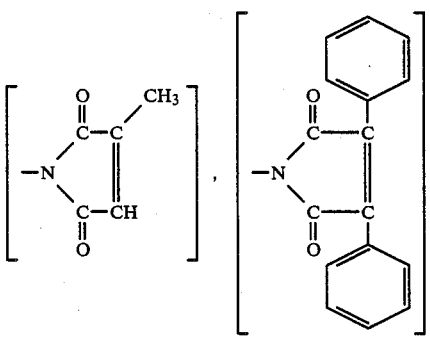

Of these epoxy groups and unsaturated double bonds, two or more kinds may exist as a mixture in one molecule.

In some cases, the epoxy group and the group having the unsaturated double bond may have a halogen atom such as chlorine atom, bromine atom and fluorine atom or an alkyl group having 1 to 12 carbon atoms substituted for the hydrogen atom. Such an alkyl group may be, for example, methyl, ethyl, n-propyl, isopropyl, n-butyl, isobutyl, sec-butyl, tert-butyl, n-pentyl, isopentyl, neopentyl, hexyl, heptyl, octyl, nonyl, dodecyl and the like.

The epoxy compound having such groups may have any desired structure depending on the use. For example, a desired compound may be obtained according to the following reaction. That is, an unsaturated carboxylic acid can be allowed to react with a conventional epoxy compound in an organic solvent in the presence of a catalyst such as choline chloride, etc.

The unsaturated carboxylic acid employed here may include, for example, acrylic acid, methacrylic acid, cinnamic acid, maleic acid and derivatives of these. On the other hand, the epoxy compound may be any one having at least one epoxy group in the molecule, which may be either a mono-functional epoxy compound or a poly-functional epoxy compound.

Examples of mono-functional epoxy compound include, ethylene oxide, propylene oxide, butylene oxide, styrene oxide, phenylglycidyl ether, butylglycidyl ether and the like.

On the other hand, poly-functional epoxy compounds are not particularly limited but inclusive of epoxy resins generally known in the art. Typical examples are bisphenol A type epoxy resins; bisphenol F type epoxy resins; phenol-novolac type epoxy resins; alicyclic epoxy resins; epoxy resins containing heterocycic ring such as triglycidyl isocyanurate, hydantoin epoxy, etc.; hydrogenated bisphenol A type epoxy resins; aliphatic epoxy resins such as propylene glycol-diglycidyl ether, pentaerythritol-polyglycidyl ether, etc.; glycidyl ester type epoxy resins obtained by the reaction between aromatic, aliphatic or alicyclic carboxylic acids and epichlorohydrin; spiro ring-containing epoxy resins; glycidyl ether type epoxy resins which are reaction products between o-allyl-phenol novolac compounds and epichlorohydrin; glycidyl ether type epoxy resins which are reaction products between diallyl bisphenol compound having allyl groups at the o-position of the respective hydroxy groups of bisphenol A and epichlorohydrin; and the like.

In this invention, one or two or more compounds selected from the group consiting of the mono-functional epoxy compounds and the poly-functional epoxy compounds as mentioned above may be used.

Specific examples of the epoxy compounds obtained in the above reaction are enumerated below:

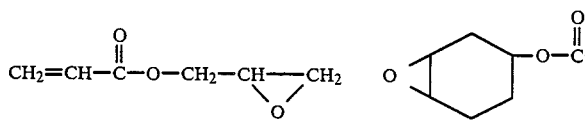
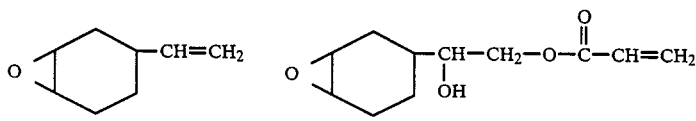
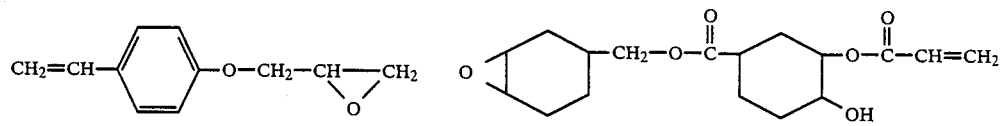
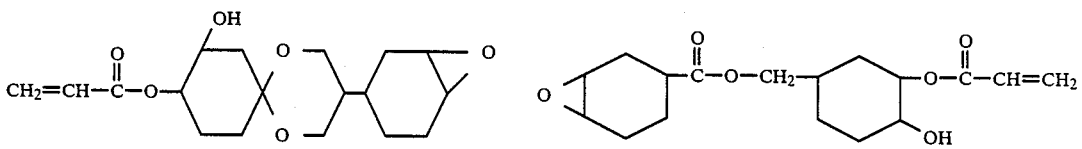
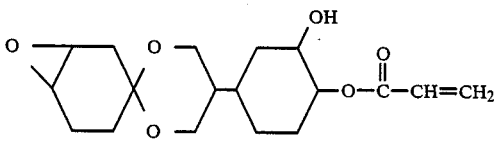
(X = H, CH₃)
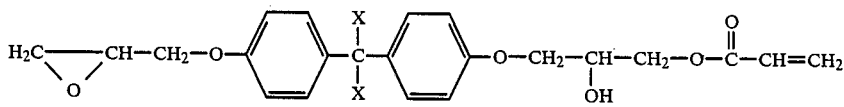
(n=integer of 0 or more, m=integer of 1 or more)
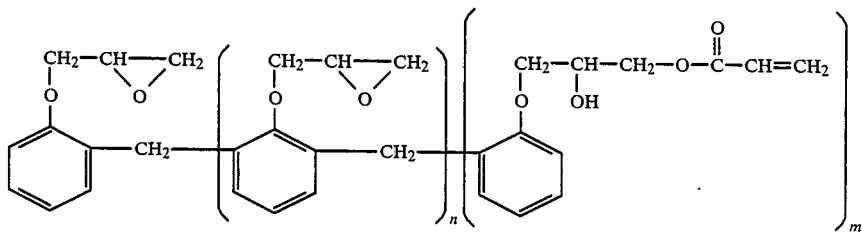
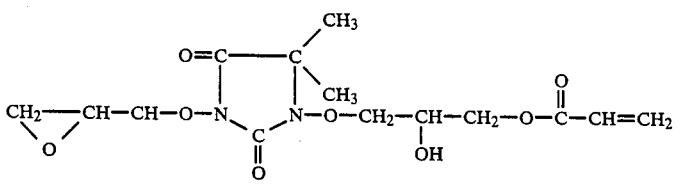
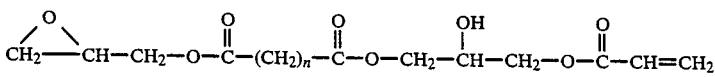
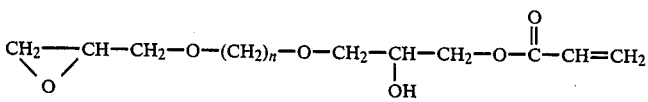
(n=integer of 2 or more)

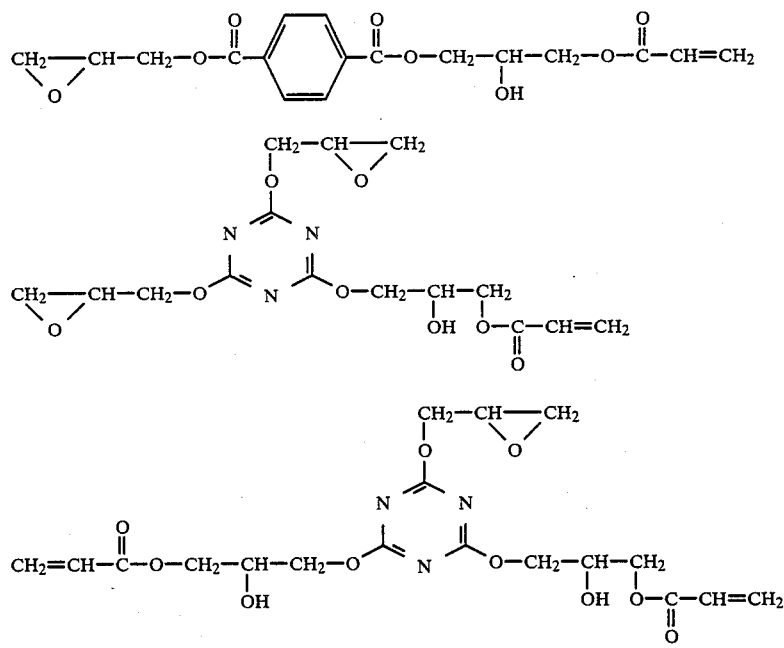

and the compounds wherein the acrylic group

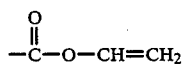

in the above formulae is converted to a methacrylic group

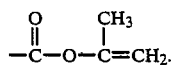

If desired, it is also possible to incorporate an epoxy compound having no unsaturated double bond in an amount ranging from 5 to 95 wt. % based on such an epoxy compound of this invention.

The metal compounds, which is the second component in this invention, is generally an organic metal compound. Organic metal compounds may include, for example, complex compounds in which at least one of alkoxy groups, phenoxy groups, acyloxy groups, β-diketonato groups and o-carbonylphenolato groups are bonded to atoms such as titanium (Ti), vanadium (V), chromium (Cr), manganese (Mn), iron (Fe), cobalt (Co), nickel (Ni), copper (Cu), zinc (Zn), aluminum (Al), zirconium (Zr), etc.

Of the alkoxy groups, those having 1 to 10 carbon atoms are preferred, as exemplified by methoxy group, ethoxy group, n-propoxy group, n-butoxy group, sec-butoxy group, tert-butoxy group, n-pentyloxy group, n-hexyloxy group, n-heptyloxy group, etc; examples of the phenoxy group are phenoxy group, o-methylphenoxy group, o-methoxyphenoxy group, p-nitrophenoxy group, 2,6-dimethylphenoxy group, etc; examples of the acyloxy group are acetate, propionate, isopropionate, butylate, stearate, ethylacetoacetate, propylacetoacetate, isopropylacetoacetate, n-butylacetoacetate, sec-butylacetoacetate, diethylmalonate, dipivalaloylmethanate, etc.; examples of the β-diketonato group are ligands such as acetylacetonato, trifluoroacetylacetonato, hexafluoroacetylacetonato,

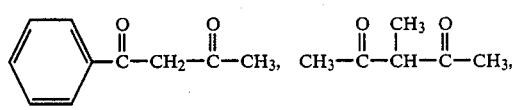

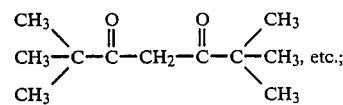

and examples of the o-carbonylphenolato group are a salicylaldehydato group, etc.

Of the above metal compounds, aluminum compounds are most preferred. Examples of the aluminum compounds are trismethoxyaluminum, trisethoxyaluminum, trisisopropoxyaluminum, trisphenoxyaluminum, trisparamethylphenoxyaluminum, isopropoxydiethoxyaluminum, trisbuthoxyaluminum, trisacetoxyaluminum, trisstearatoaluminum, trisbutylatoaluminum, trispropionatoaluminum, trisisopropionatoaluminum, trisacetylacetonatoaluminum, trisfluoroacetylacetonatoaluminum, trishexafluoroacetylacetonatoaluminum, trisethylacetoacetatoaluminum, trissalycilaldehydatoaluminum, trisdiethylmalonatoaluminum, trispropylacetoacetatoaluminum, trisbutylacetoacetatoaluminum, trisdipivaloylmethanatoaluminum, diacetylacetonatodipivaloylmethanatoaluminum,

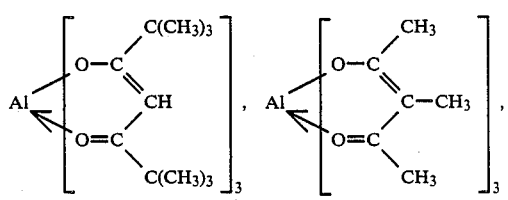

-continued

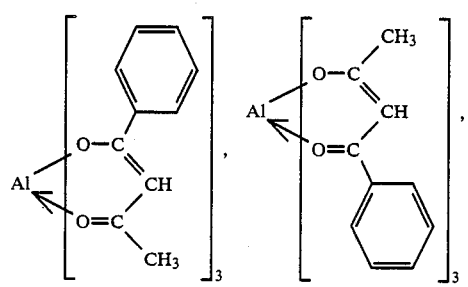

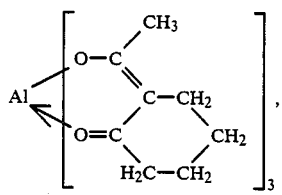

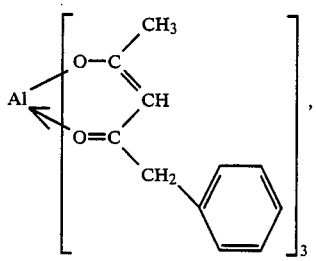

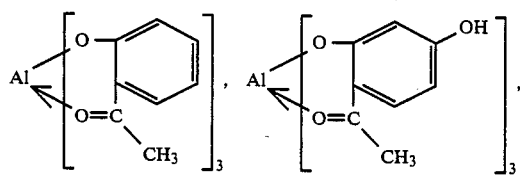

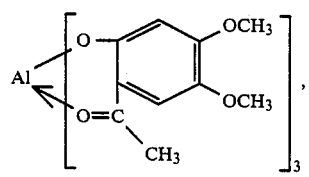

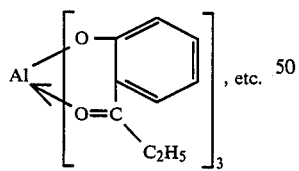, etc.

These metal compounds may be used alone or in combination. The compound(s) should be mixed preferably in an amount of 0.001 to 10% by weight, more preferably in an amount ranging from 0.1 to 5% by weight, based on the epoxy resin. If the amount is less than 0.001% by weight, sufficient curability of the product will not be obtained; if it exceeds 10% by weight on the other hand, a high cost of production and a poor adhesion property of the product will be caused thereby.

The salient feature of the paint composition of this invention resides in containing a silicon compound capable of forming a silanol group by irradiation of light as the third component. Such a silicon compound may preferably be a silicon compound having any of peroxysilano group, o-nitrobenzyloxy group and α-ketosilyl group.

Silicon compounds having peroxysilano group are represented by the formula:

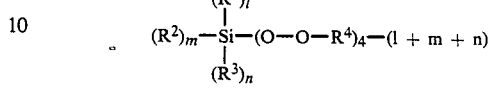

wherein $R^1$, $R^2$, $R^3$ and $R^4$ may be either identical or different and each represent a hydrogen atom, a halogen atom, an alkyl group having 1 to 5 carbon atoms, an alkoxy group having 1 to 5 carbon atoms, an aryl group or an aralkyl group; and l, m and n are integers satisfying the conditions of $0 \leq l,m,n \leq 3$, $1 \leq l+m+n \leq 3$.

In the above formula, the halogen atoms may be, for example, chlorine atom or bromine atom; the alkyl group having 1 to 5 atoms may be, for example, methyl, ethyl, n-propyl, isopropyl, n-butyl, isobutyl, sec-butyl, tert-butyl, n-pentyl, isopentyl or neopentyl; the alkoxy group may be, for example, methoxy, ethoxy, n-propoxy, n-butoxy, sec-butoxy, tert-butoxy, n-pentyloxy, etc.; the aryl group may be a phenyl group, a naphthyl group or an anthranyl group; and the aralkyl group may be, for example, a benzyl group, a phenethyl group, etc. These groups may also have substituents such as halogen atoms, nitro group, cyano group, methoxy group, etc.

Specific examples of such silicon compounds are enumerated below:

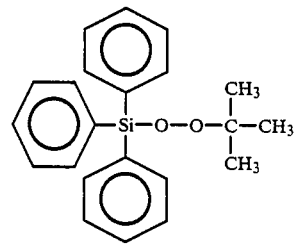

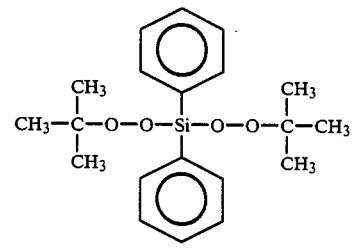

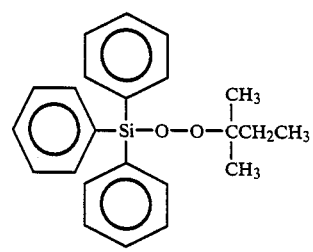

-continued

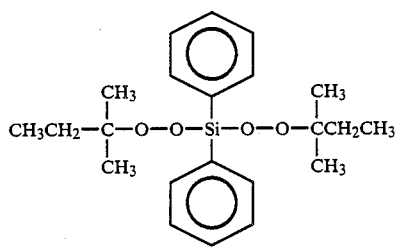

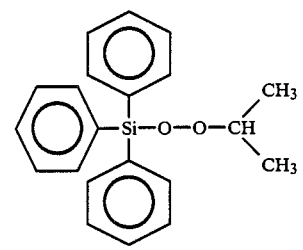

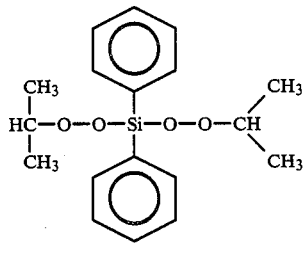

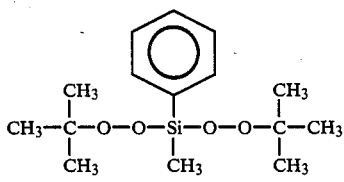

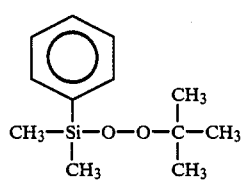

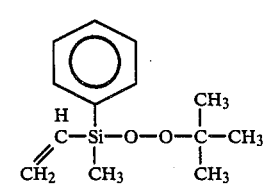

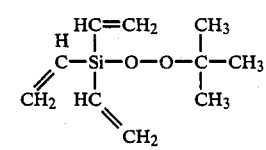

-continued

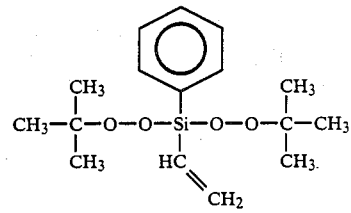

Silicon compounds having o-nitrobenzyloxy group are represented by the formula:

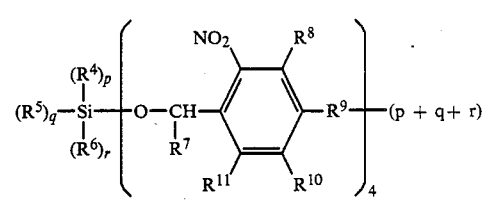

wherein $R^4$, $R^5$ and $R^6$ may be either identical or different and each represent a hydrogen atom, a halogen atom a vinyl group, an allyl group, an unsubstituted or substituted alkyl group having 1 to 10 carbon atoms, an alkoxy group having 1 to 10 carbon toms, an unsubstituted or substitured aryl group, aryloxy group or siloxy group; $R^7$ represents a hydrogen atom, an unsubstituted or substituted alkyl group having 1 to 10 carbon atoms, a phenyl group or a substituted phenyl group; $R^8$, $R^9$, $R^{10}$ and $R^{11}$ may be identical or different and each represent a hydrogen atom, a nitro group, a cyano group, a hydroxy group, a mercapto group, a halogen atom, an acetyl group, an allyl group, an alkyl group having 1 to 5 carbon atoms, an alkoxy group having 1 to 5 carbon atoms, an unsubstituted or substituted aryl group or aryloxy group; p, q and r are integers satisfying the conditions of $0 \leq p,q,r \leq 3$, $1 \leq p+q+r \leq 3$.

In the above formula, halogen atoms may be, for example, chlorine atom, bromine atom, etc.; the unsubstituted or substituted alkyl having 1 to 10 carbon atoms (or 1 to 5 carbon atoms) may be, for example, methyl, ethyl, n-propyl, n-butyl, tert-butyl, n-pentyl, chloromethyl, chloroethyl, fluoromethyl, cyanomethyl, and the like; the alkoxy group having 1 to 10 carbon atoms (or 1 to 5 carbon atoms) may be, for example, methoxy, ethoxy, n-propoxy, n-butoxy and the like; the unsubstituted or substituted aryl may be, for example, phenyl, p-methoxyphenyl, p-chlorophenyl, p-trifluorometnylphenyl, etc.; and the aryloxy group may be, for example, phenoxy.

Alternatively, the above silicon compound may be a compound having as a terminal group the o-nitrobenzyloxysilyl group and as a principal chain a group represented by the formula:

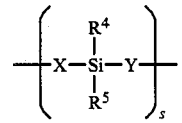

wherein s is an integer of 0 or 1 to 100, preferably 0 or 1 to 10; $R^4$ and $R^5$ are as defined in the foregoing; X and Y may be same or different and each represent an oxygen atom, an alkylene group, an aryl group, or the like.

Examples of the organic silicon compound (iii) having the substituted or unsubstituted o-nitrobenzyloxy group bonded directly to a silicon atom are the following compounds;

(1) trimethyl(o-nitrobenzyloxy)silane,
(2) dimethylphenyl(o-nitrobenzyloxy)silane,
(3) diphenylmethyl(o-nitrobenzyloxy)silane,
(4) triphenyl(o-nitrobenzyloxy)silane,
(5) vinylmethylphenyl(o-nitrobenzyloxy)silane,
(6) t-butylmethylphenyl(o-nitrobenzyloxy)silane,
(7) triethyl(o-nitrobenzyloxy)silane,
(8) tri(2-chloroethyl)-o-nitrobenzyloxysilane,
(9) tri(p-trifluoromethylphenyl)-o-nitrobenzyloxysilane,
(10) trimethyl[α-(o-nitrophenyl)-o-nitrobenzyloxy]silane,
(11) dimethylphenyl[α-(o-nitrophenyl)-o-nitrobenzyloxy]-silane,
(12) methylphenyldi[α-o-nitrophenyl)-o-nitrobenzyloxy]-silane,
(13) triphenyl(α-ethyl-o-nitrobenzyloxy)silane,
(14) trimethyl(3-methyl-2-nitrobenzyloxy)silane,
(15) dimethylphenyl(3,4,5-trimethoxy-2-nitrobenzyloxy)silane,
(16) triphenyl(4,5,6-trimethoxy-2-nitrobenzyloxy)silane,
(17) diphenylmethyl(5-methyl-4-methoxy-2-nitrobenzyloxy)silane,
(18) triphenyl(4,5-dimethyl-2-nitrobenzyloxy)silane,
(19) vinylmethylphenyl(4,5-dichloro-2-nitrobenzyloxy)silane,
(20) triphenyl(2,6-dinitrobenzyloxy)silane,
(21) diphenylmethyl(2,4-dinitrobenzyloxy)silane,
(22) triphenyl(3-methoxy-2-nitrobenzyloxy)silane,
(23) vinylmethylphenyl(3,4-dimethoxy-2-nitrobenzyloxy)silane,
(24) dimethyldi(o-nitrobenzyloxy)silane,
(25) methylphenyldi(o-nitrobenzyloxy)silane,
(26) vinylphenyldi(o-nitrobenzyloxy)silane,
(27) t-butyldi(o-nitrobenzyloxy)silane,
(28) diethyldi(o-nitrobenzyloxy)silane,
(29) 2-chloroethylphenyldi(o-nitrobenzyloxy)silane,
(30) diphenyldi(o-nitrobenzyloxy)silane,
(31) diphenyldi(3-methoxy-2-nitrobenzyloxy)silane,
(32) diphenyldi(3,4-dimethoxy-2-nitrobenzyloxy)silane,
(33) diphenyldi(2,6-dinitrobenzyloxy)silane,
(34) diphenyldi(2,4-dinitrobenzyloxy)silane,
(35) methyltri(o-nitrobenzyloxy)silane,
(36) phenyltri(o-nitrobenzyloxy)silane,
(37) p-bis(o-nitrobenzyloxydimethylsilyl)benzene,
(38) 1,1,3,3-tetraphenyl-1,3-di(o-nitrobenzyloxy)siloxane,
(39) 1,1,3,3,5,5-hexaphenyl-1,5-di(o-nitrobenzyloxy)-siloxane, and
(40) a silicon compound formed by reaction of SiCl-containing silicone resin and o-nitrobenzylalcohol.

Silicon compounds having α-ketosilyl group are represented by the formula:

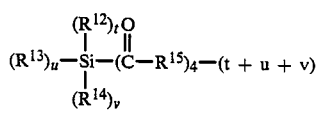

wherein $R^{12}$, $R^{13}$, $R^{14}$ and $R^{15}$ may be identical or different and each represent a hydrogen atom, a vinyl group, an allyl group, an alkyl group having 1 to 10 carbon atoms, an alkoxy group having 1 to 10 carbon atoms, an aryl group or an aryloxy group; t, u and v are integers satisfying the conditions of $0 \leq t,u,v \leq 3$, $1 \leq t+u+v \leq 3$.

In the above formula, the alkyl group having 1 to 10 carbon atoms may be, for example, methyl, ethyl, n-propyl, n-butyl, tert-butyl, n-pentyl, neopentyl, n-hexyl, n-heptyl, n-octyl and the like; the alkoxy group having 1 to 10 carbon atoms may be, for example, methoxy, ethoxy, n-propoxy, n-butoxy, tert-butoxy, n-pentyloxy, neopentyloxy, n-hexyloxy, n-heptyloxy, n-octyloxy and the like; the aryl group may be, for example, phenyl, naphthyl, etc.; the aryloxy group may be, for example, phenoxy, naphthyloxy, etc. These groups may also have substituents such as halogen atoms, nitro group, cyano group, methoxy group, etc.

Specific examples of such silicon compounds are the following compounds:

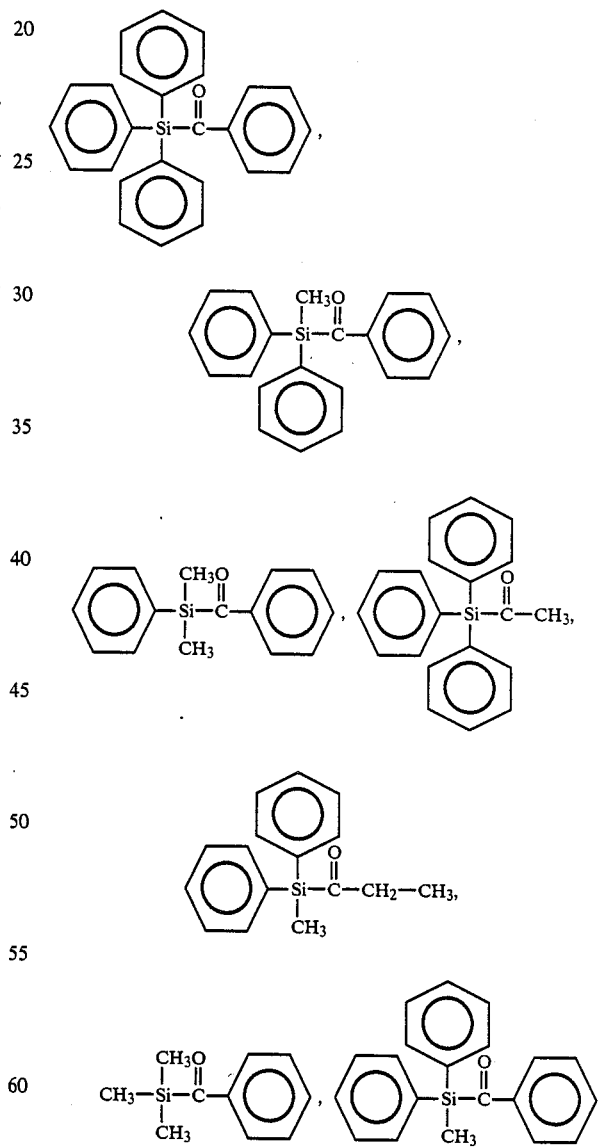

The above silicon compounds may be used either as one compound or as a mixture of two or more compounds, and in an amount generally of 0.1 to 20 wt. %, preferably of 1 to 10 wt. %, based on the epoxy compound. When the amount is less than 0.1 wt. %, no curing characteristic can be obtained, while use in excess of 20 wt. % may be possible, but results unfavorably in increased cost or troubles which may be caused by the products formed by decomposition of the catalyst component.

As the photosensitizer used in this invention, there may be employed any of those which are capable of photosensitizing the foregoing compounds, and which are selected depending on the kinds of the epoxy resins, light source, etc.

Examples of the above photosensitizers are aromatic hydrocarbons, benzophenone and derivatives thereof, esters of o-benzoylbenzoic acids, acetophenone and derivatives thereof, benzoin and benzoin ethers and derivatives thereof, xanthone and derivatives thereof, thioxanthone and derivatives thereof, disulfide compounds, quinone compounds, halogenated hydrocarbons, amines, etc.

Examples of the aromatic hydrocarbon are benzene, benzene-d6, toluene, p-xylene, fluorobenzene, chlorobenzene, bromobenzene, iodobenzene, naphthalene, 1-methylnaphthalene, 2-methylnaphthalene, 1-fluoronaphthalene, 1-chloronaphthalene, 2-chloronaphthalene, 1-bromonaphthalene, 2-bromonaphthalene, 1-iodonaphthalene, 2-iodonaphthalene, 1-naphthol, 2-naphthol, biphenyl, fluorene, p-terphenyl, acenaphthene, p-quaterphenyl, triphenylene, phenanthrene, azulene, fluoranthene, chrycene, pyrene, 1,2-benzpyrene, anthracene, 1,2-benzanthracene, 9,10-dichloroanthracene, 9,10-dibromoanthracene, 9,10-diphenylanthracene, perylene, tetracene, pentacene, etc.

Examples of the benzophenone and the derivatives thereof are benzophenone, 2,4-dimethylbenzophenone, 2,4-dichlorobenzophenone, 4,4'-bis(dimethylamino)-benzo- phenone, etc.

Examples of the esters of o-benzoylbenzoic acids are methyl o-benzoylbenzoate, ethyl o-benzoylbenzoate, phenyl o-benzoylbenzoate,

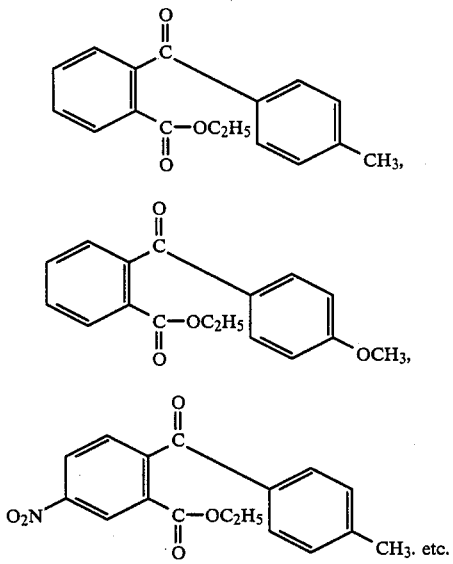

Examples of the acetophenone and the derivatives thereof are acetophenone, 4-methylacetophenone, 3-methylacetophenone, 3-methoxyacetophenone, etc.

Examples of the benzoin, the benzoin ethers and the derivatives of these are benzoin, benzoin methyl ether, benzoin ethyl ether, benzoin isopropyl ether, benzoin n-butyl ether, benzoin triphenylsilyl ether,

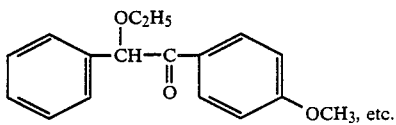

Examples of the xanthone and the derivatives thereof are xanthone, 2,4-dimethylxanthone, 2,4-dichloroxanthone, etc.

Examples of the thioxanthone and the derivatives thereof are thioxanthone, 2,4-dimethylthioxanthone, 2,4-dichlorothioxane, etc.

Examples of the disulfide compounds are;

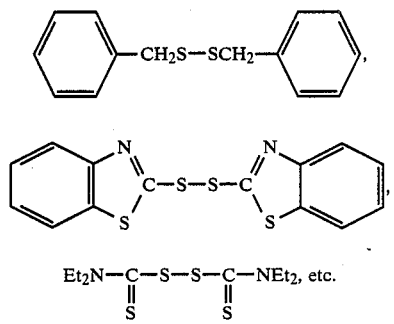

Examples of the quinone seriese compounds are benzoquinone, naphthoquinone, anthraquinone, 5,12-naphthacene dione, 2,7-pyrene dione, etc.

Examples of the halogenated hydrocarbons are carbon tetrachloride, hexachloroethane, carbon tetrabromide,

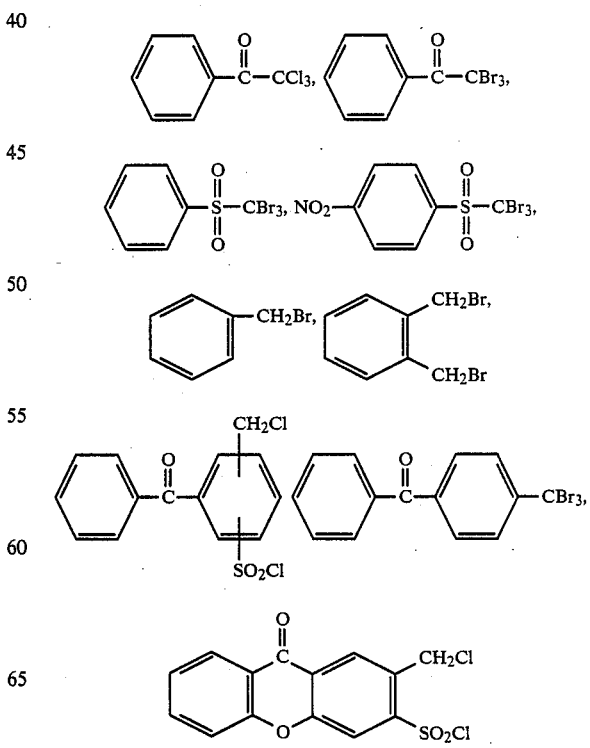

-continued

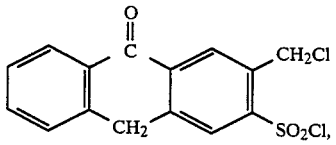

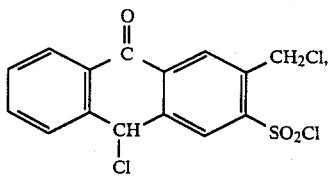

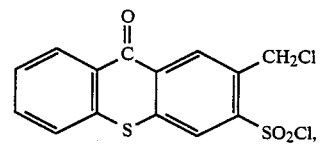

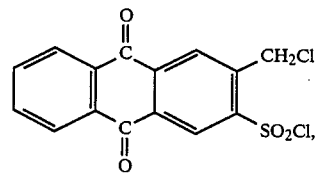

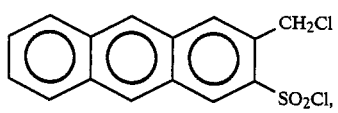

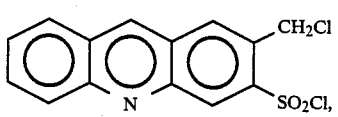

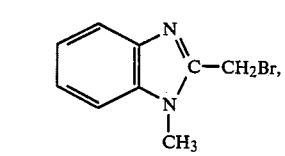

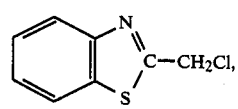

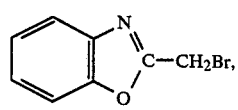

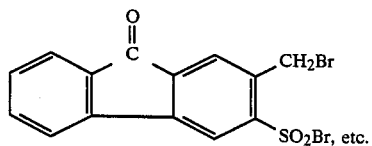

Examples of the amines are diphenylamine, carbazole, triphenylamine,

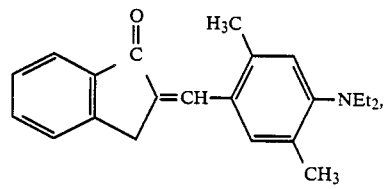

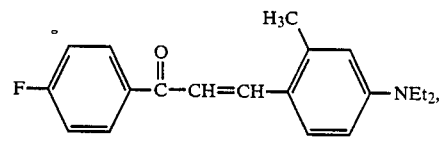

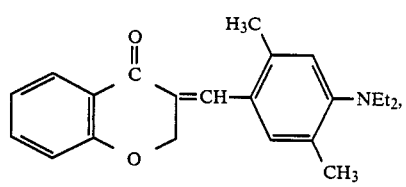

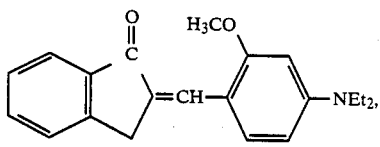

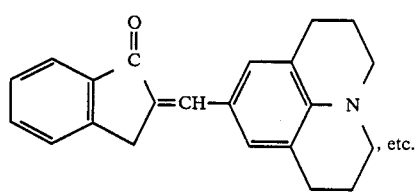

Examples of the other photosensitizers are propiophenone, anthrone, benzaldehyde, butylophenone, 2-naphthylphenylketone, 2-naphthaldehyde, 2-acetonaphthone, 1-naphtylphenylketone, 1-acetonaphthone, 1-naphthoaldehyde, fluorenone, 1-phenyl-1,2-propane dione, benzoethrile, acetone, biacetyl, acridine orange, acridine, Rhodamine-B, eosine, fluorescein,

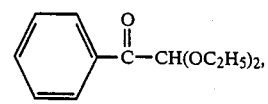

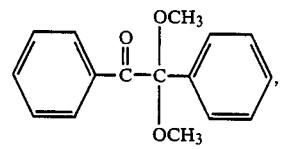

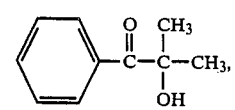

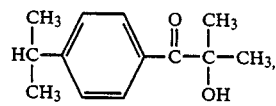

-continued

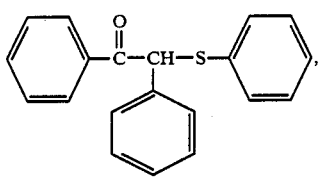

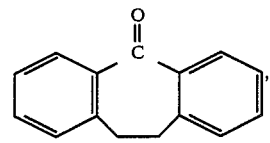

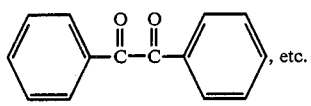, etc.

The photosensitizers exemplified in the above may be used alone or in combination, and should be mixed preferably in an amount of from 0.001 to 10% by weight, more preferably 0.01 to 5% by weight, based on the epoxy resin.

The photocurable composition of this invention may also contain, if desired, an acid anhydride or a phenol derivative or an additive such as a colorant or an inorganic filler incorprated therein.

The photocurable composition of this invention can be cured according to any curing method, depending on the purpose and use, such as photocuring, photocuring under heating, after-cure after photocuring, etc. Preferably, photocuring alone or photocuring under heating may be employed. During this operation, the wavelength of the light to be irradiated may differ depending on the compotision employed, but it is generally 180 to 700 nm. Above all, irradiation of UV-ray is effective. The time for light irradiation differs depending on the composition of the photocurable epoxy compound, the catalyst employed and the light source, but generally 1 second to 180 minutes, preferably several seconds to 10 minutes. The heating temperature when carrying out photocuring under heating may differ depending on the composition of the epoxy compound and the catalyst employed, but generally ranges from 10° to 200° C., preferably from 60° to 150° C. The light source may be any one generally employed for photocuring, including low pressure mercury lamp, high pressure mercury lamp, carbon arc lamp, metal halogen lamp, xenon lamp, hydrogen discharging tube, tungsten lamp, halogen lamp, sodium discharging tube, neon discharging tube, argon discharging tube, He-Ne laser, Ar ion laser, $N_2$ laser, Cd ion laser, He-Cd laser, dye laser, etc. One or two or more kinds of light sources selected from the group consisting of these may be used as desired. When after-cure is conducted after photocuring, the conditions may differ depending on the composition of the photocurable composition and the catalyst employed, but generally at 50° to 200° C., preferably 100° to 180° C., generally for 10 minutes to 10 hours, preferably 20 minutes to 5 hours.

The photocurable composition of this invention is very short in time required for curing, particularly the so called tack-free time. For example, when the composition of this invention is compared with a composition employing an epoxy compound having no double bond in place of the epoxy compound having the double bond of this invention, the curing time can be shortened to ½, and the tack-free time to about 1/10. Also, since no ionic impurity is contained in the composition, there is no fear of deterioration of the chracteristics of the cured product or generation of corrosion phenomenon. Further, the cured product obtained is very excellent in mechanical, physical and electrical characteristics and therefore useful in wide fields of applications such as ink, paint, adhesive, surface coating, plate-making material, sealant, electrical insulating material, etc.

EXAMPLES 1 TO 6

Into a four-necked flask equipped with a thermometer, a reflux condenser, a $N_2$ gas inlet and a stirrer, 290 g of Seloxide 2021 (trade name, produced by Dicel Chemical Industries, Ltd., alicyclic type, epoxy equivalent: 145), 72 g of acrylic acid, 158 g of toluene, 0.01 g of hydroquinone and 1.56 g of choline chloride as the catalyst were charged and, after replacement with $N_2$ gas, the temperature was gradually elevated with stirring to carry out the reaction at the reflux temperature of toluene. The amount of acrylic acid consumed was monitored by measurement of the acid value with 0.1N standard NaOH solution and the reaction was completed at the point when the acid value became substantially zero. After completion of the reaction, the reaction mixture was mixed with 500 ml of deionized water, washed six times and then the toluene was separated by a dropping funnel, followed by evaporation of toluene under reduced pressure. The compound obtained (hereinfter abbreviated as CYEPAC) had a viscosity of 160 poise (25° C.) and an epoxy equivalent of 368 (theoretical value 362).

In addition to the CYEPAC obtained, there were employed as epoxy resins Seloxide 2021 (trade name, produced by Dicel Chemical Co., Ltd.; alicyclic type, epoxy equivalent 145), Epikote 828 (trade name, produced by Shell Chemical Co.; bisphenol A type, epoxy equivalent 190 to 210) asnd Epikote 1001 (trade name, produced by Shell Chemical Co.; bisphenol A type, epoxy equivalent 450 to 525, molecular weight 900), as organic aluminum compounds triethylacetoacetatoaluminum (TEAACA), trispropylacetoacetatoaluminum (TPAAA), trisacetylacetonatoaluminum (TAANA) and trissalicylaldehydatoaluminum (TSAA), as organic silicon compounds those represented by the following formulae:

(a)

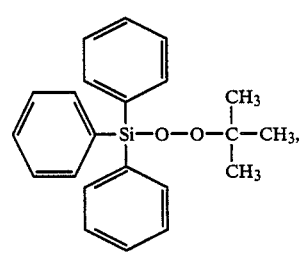

-continued

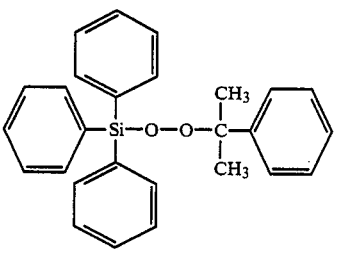
(b)

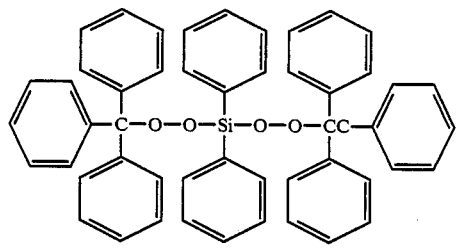
(c)

and benzophenone and thioxanthone as the photosensitizer.

These compounds were formulated according to the compositions (represented in parts by weight) as indicated in Table 1 to prepare 6 kinds of the compositions of this invention.

These compositions were applied in a conventional manner on a tinplate treated with No. 400 sand paper. Then, these samples were introduced in a photocuring box with three air-cooled mercury lamps of 80 W/cm arranged at a height of 10 cm from the conveyer surface, and photocuring was effected at a conveyer speed of 10 m/min. Irradiation within the box was repeated until all the curing was completed as confirmed by finger contact.

After completion of curing, the pencil hardness test of the coated film, and the peel-off test with tacky tape after the film was cut in checkers were conducted for examination of the surface hardness and adhesion to a tinplate. Also, prior to photocuring, the days until gelation were also examined by leaving the photocurable composition to stand in a dark place at 25° C.

For comparative purpose, UV-ray curable resin was synthesized by the reaction between 280 g of Epikote 828 and 114 g of acrylic acid in the presence of each 0.5 g of hydroquinone and triethylenediamine. The resultant resin was confirmed to have no epoxy group and all attached with acrylic groups by measurement of the epoxy equivalent and IR. Then, 200 g of the resin was mixed with 10 g of benzophenone and 15 g of pentaerythritol acrylate to prepare a photocurable composition, which was used as Control. Then, this resin was subjected to photocuring similarly as Examples and the characteristics of the coated film were examined.

All of the above results are listed in Table 1.

EXAMPLES 7 TO 12

The photocurable composition of Example 1 was further formulated with titanium oxide, calcium carbonate, zinc stearate, phthalocyanine green, phthalocyanine blue or carbon black as the pigment at the proportion as indicated in Table 2 (represented in parts by weight per 100 parts of the composition of Example 1) to prepare six kinds of paint compositions.

These compositions were applied on tinplates in entirely the same manner as in Examples 1 to 6, cured, dried with finger contact and subjected to measurement of pencil hardness and adhesion. Results are shown together in Table 2. The Control employed was prepared by incorporating carbon black into the Control in Examples 1 to 6.

EXAMPLES 13 TO 18

In synthesis of the photocurable compound employed in Examples 1 to 6, Epikote 152 (trade name, produced by Shell Chemical Co.; phenol-novolac type epoxy resin, epoxy equivalent 172 to 179) was employed in place of Seloxide 2021, and acrylic acid was formulated in amounts of $\frac{1}{2}$ equivalent and $\frac{1}{4}$ equivalent per one epoxy equivalent of the epoxy rsin, respectively, and the reaction was conducted in entirely the same manner as in Example to prepare two kinds of photocurable epoxy compounds with an epoxy equivalent of 452 (hereinafter abbreviated as PNEPAC 2) and with an epoxy equivalent of 248 (hereinafter abbreviated as PNEPAC 4).

In addition to the two kinds of the photocurable compounds, there were employed Seloxide 2021 and Chissonox (trade name, produced by Tisso Corporation, alicyclic epoxy resin, epoxy equivalent about 140) as the epoxy resins, trisethylacetoacetatoaluminum (TEAACA) as the organic metal compound, triphenyl-(o-nitrobenzyloxy)silane (TPONS), triphenyl(tert-butylperoxy)silane (TPTP) and triphenylbenzoylsilane (TPBS) as the organic silicon compound and further benzophenone as the photosensitizer. As the pigment, phthalocyanine green and zinc phosphate (ZPF: trade name, produced by Sakai Chemical Industry Co., Ltd.), and further glass flakes with purity of 99% or higher, thickness of 4 μm, particle sizes of 20 to 24 mesh and apparent specific gravity of 0.29 g/ml were employed as the inorganic filler.

The above components were mixed uniformly at proportions as indicated in Table 3 (represented in parts by weight) to prepare lining composition.

On the other hand, for the purpose of comparison, a polyester resin type lining composition was prepared from 5 parts by weight of Rigolac 150 R (trade name, produced by Showa Highpolymer Co., Ltd., iso-phthalic acid type polyester resin), 45 parts by weight of styrene, 0.7 part of cobalt naphthenate and 15 parts by weight of glass flakes of the same recipe as mentioned above, and this composition was used as Control.

Each of various lining compositions as described above was applied on a soft steel with dimensions of 120×40×1.6 mm previously subjected to rust removal with sand paper and washing for defatting to a thickness of 0.5 mm. Then, these samples were introduced into a UV-ray photocuring device adjusted to the intensity of 80 W/cm for photocuring. As for the Control, it was cured by drying at room temperature for 7 days.

Each test strip thus obtained was immersed in 5% caustic soda solution (alkali resistance test), 15% hydrochloric acid solution (acid resistance test) and tap water (water resistance test), and presence of rust generated and the state of the coated film were observed.

The results are listed comprehensively in Table 3.

TABLE 1

|  | Example 1 | Example 2 | Example 3 | Example 4 | Example 5 | Example 6 | Control |
|---|---|---|---|---|---|---|---|
| Epoxy resin: | | | | | | | |
| CYEPAC | 100 | 100 | 100 | 80 | 80 | 70 | |
| Seloxide 2021 | — | — | — | 20 | — | 20 | |
| Epikote 828 | — | — | — | — | 20 | — | |
| Epikote 1001 | — | — | — | — | — | 10 | |
| Organic metal compounds: | | | | | | | |
| TEAACA | 1.0 | — | — | — | — | — | |
| TPAAA | — | 1.0 | — | — | — | — | |
| TAANA | — | — | 0.5 | — | — | — | |
| TSAA | — | — | 0.5 | — | — | — | |
| Organic silicon compound: | | | | | | | |
| (a) | 2.0 | 0 | 2.0 | 4.0 | 4.0 | 4.0 | |
| (b) | — | 4.0 | — | — | — | — | |
| (c) | — | — | 1.0 | 0 | — | — | |
| Sensitizer: | | | | | | | |
| Benzophenone | 0.5 | — | 0.5 | 0.5 | — | 0.5 | |
| Thioxanthone | — | 0.5 | — | — | 0.5 | — | |
| Measurement results: | | | | | | | |
| Days before gelation (dark place, 25° C.) | >30 | >30 | >30 | >30 | >30 | >30 | >30 |
| Thickness of coating (μm) | 22 | 25 | 20 | 20 | 24 | 25 | 20 |
| Dryness by finger touch (times) | 1 | 1 | 1 | 2 | 3 | 3 | 1 |
| Pencil hardness (JIS) | 2H | 2H | 2H | H | H | H | B |
| Adhesion (*) | 100/100 | 100/100 | 100/100 | 100/100 | 95/100 | 98/100 | 50/100 |

(*) Number of checkers remained of 100 checkers

TABLE 2

|  | Example 7 | Example 8 | Example 9 | Example 10 | Example 11 | Example 12 | Control |
|---|---|---|---|---|---|---|---|
| Pigments: | | | | | | | |
| Titanium oxide | 10 | — | — | — | — | — | |
| Calcium carbonate | — | 50 | — | — | — | — | |
| Zinc stearate | — | — | 50 | — | — | — | |
| Phthalocyanine green | — | — | — | 5 | — | — | |
| Phthalocyanine blue | — | — | — | — | 5 | — | |
| Carbon black | — | — | — | — | — | 10 | 10 |
| Measurement results: | | | | | | | |
| Thickness of coating (μm) | 30 | 30 | 30 | 30 | 30 | 25 | 25 |
| Dryness by finger touch (times) | 2 | 3 | 3 | 2 | 2 | 2 | >5 |
| Pencil hardness | 2H | 2H | 2H | 3H | 3H | 3H | B |
| Adhesion | 80/100 | 90/100 | 90/100 | 95/100 | 95/100 | 90/100 | 15/100 |

TABLE 3

|  | Example 13 | Example 14 | Example 15 | Example 16 | Example 17 | Example 18 | Control |
|---|---|---|---|---|---|---|---|
| Epoxy resin: | | | | | | | |
| PNEPAC 2 | 100 | 80 | 70 | — | — | — | |
| PNEPAC 4 | — | — | — | 100 | 80 | 80 | |
| Seloxide 2021 | — | 20 | — | — | 20 | — | |
| Chissonox 234 | — | — | 30 | — | — | 20 | |
| Organic metal compound: | | | | | | | |
| TEAACA | 1.0 | 1.0 | 1.0 | 1.0 | 1.0 | 1.0 | |
| Organic silicon compound: | | | | | | | |
| TPONS | — | — | — | 4.0 | 4.0 | 3.0 | |
| TPTP | 2.0 | 1.0 | 4.0 | — | — | — | |
| TPBS | — | 1.0 | — | — | — | 1.0 | |
| Sensitizer: | | | | | | | |
| Benzophenone | 0.5 | 0.5 | 0.5 | — | — | — | |
| Pigment: | | | | | | | |
| Phthalocyanine green | — | 5 | — | 5 | — | — | |
| ZPF | — | — | 5 | — | — | — | — |
| Filler: | | | | | | | |
| Glass flake | 15 | — | — | — | 15 | — | |
| Test item: | | | | | | | |
| Alkali resistance test: | | | | | | | |

TABLE 3-continued

|  | Example 13 | Example 14 | Example 15 | Example 16 | Example 17 | Example 18 | Control |
|---|---|---|---|---|---|---|---|
| Acid resistance test: | No abnormality after 6 months | No abnormality after 6 months | No abnormality after 6 months | No abnormality after 6 months | No abnormality after 6 months | No abnormality after 6 months | Corroded 2 months |
| Water resistance: | No abnormality | No abnormality | No abnormality | No abnormality | No abnormality | No abnormality | Corroded |
|  | No abnormality | No abnormality | No abnormality | No abnormality | No abnormality | No abnormality | Rust generated in one month |

EXAMPLES 19 AND 20

In the photocurable compounds synthesized in Examples 1 to 6, cinnamic acid and methacrylic acid were employed in place of acrylic acid, formulated each at a proportion of ½ relative to the epoxy equivalent of Seloxide 2021 and the reactions conducted under entirely the same conditions to synthesize two kinds of photocurable compounds.

The epoxy equivalent of the compound employing cinnamic acid (hereinafter abbreviated as CYKE) was 470. On the other hand, the compound employing methacrylic acid (hereinafter abbreviatd as CYMA) was found to have an epoxy equivalent of 420.

With 100 parts by weight of each of these two kinds of photocurable compounds, 0.5 part of TEAACA, 4 parts by weight of TPTP and 0.5 part of benzophenone were formulated and mixed homogeneously. By use of the resin compositions A (cinnamic acid type) and B (methacrylic acid type), 6 sheets of overlayed plain weave glass cloths previously cut in sizes of 0.12 mm × 10 cm × 20 cm sandwitched wholly between two glass plates with intermediary spacers of silicone rubber with a width of 1 mm were impregnated with each composition under 3 mm Hg at 60° to 80° C.

Then, the composite material was placed in a curing box in which two high pressure mercury lamps H1000PQ of 1 KW (produced by Toshiba Corporation) were arranged, and UV-light was irradiated on the material with rotation at a speed of 5 times/min. for 3 minutes. Further, the composite material was cured by heating to 150° C. for 30 mintues to prepare a resin plate with a thickness of 1 mm.

For each of the resin plates prepared as described above, the dielectric tangent value (tan $\delta$ value) and volume resistivity were measured, and the results are shown in Table 4.

Also, prior to photocuring, each resin composition was left to stand at 20° C. in a dark place for examination of the days required for gellation, and the results are also shown in Table 4.

TABLE 4

|  | Example 19 | Example 20 |
|---|---|---|
| Photocurability | A | B |
| Days before gelling (20° C., dark place) | >30 | >30 |
| tan $\delta$ (%) | 4.3 | 3.6 |
| Volume resistivity ($\Omega \cdot$ cm) | $1.2 \times 10^{13}$ | $7.8 \times 10^{12}$ |

EXAMPLE 21

Previously, a 10% solution having a polyvinyl alcohol with a polymerization degree of about 500 dissolved in water was prepared. In a stainless steel vessel, 40 g of this solution, 4 g of TH-106 (trade name, heatsensitive color former, produced by Hodogaya Chemical Co., Ltd.) [2-(2-chlorophenylamino)-6-diethylaminofluoran] and 90 g of glass beads with a diameter of 3 mm were charged, and the mixture was kneaded for 3 hours to obtain a composition C.

On the other hand, a composition D was prepared separately as follows. That is, 40 g of a 10% solution of polyvinyl alcohol, 7 g of bisphenol A, 10 g of distilled water and 90 g of glass beads with a diameter of 3 mm were placed in a stainless steel vessel and kneaded similarly as C to prepare a composition D.

Further, a composition E was prepared as follows. That is, 40 g of a 10% aqueous solution of polyvinyl alcohol, 7 g of dimethyl terephthalate, 10 g of distilled water and 90 g of glass beads with a diameter of 3 mm were charged into a stainless steel vessle and kneaded for three hours similarly as described above to obtain a composition E.

Subsequently, the compositions C, D and E as prepared above were mixed at proportions of 3:10:3. The heat-sensitive paint obtained was applied on a pure paper (50 g/m) (coated amount: about 5 g/m², as dry solid) and dried at room temperature.

The resultant heat-sensitive paper was coated with the photocurable composition of Example 1 (to a thickness of 5 $\mu$m) and then applied with top coating by irradiation with UV-ray by means of a UV-ray irradiating device mounted with a metal halide lamp of 80 W/cm at a distance of 25 cm from the light source. After color forming test was conducted with use of a thermotester of Rosiaceta type, dibutyl phthalate, dilauryl phthalate, dioctyl phthalate and tricresyl phosphate were applied on the surface, respectively. No fading was observed after left to stand at room temperature for one week or longer. On the other hand, when the same tests were conducted without application of top coating, fading occurred within 3 days in every sample.

EXAMPLE 22

The photocurable composition of Example 6 was injected into a transparent vessel and a light emitting element was embedded to a prescribed position, followed by irradiation of light twice each for one minute. As the light source, two high pressure mercury lamps of 2 KW output were employed and irradiation was effected at a distance of 10 cm from the light device. The resin encapsulated type light emitting source thus obtained was examined for its characteristics. The results are shown in Table 5.

TABLE 5

| | |
|---|---|
| Appearance: | Colorless, transparent |
| Humidity resistance: | No deterioration of optical output $P_o$ at 90° C., 90% RH, after 2000 hrs |
| Heat resistance: | No deterioration of optical output $P_o$ at 120° C., after 1000 hrs |
| Soldering resistance: | No generation of crack by dipping in soldering bath at 300° C. for 15 sec. |
| Continuous energizing test: | Po deterioration of −30% after 110 hrs under the conditions of $I_F = 40$ mA and 25° C. |

EXAMPLES 23 TO 27

Into a reaction vessel were charged 22 g of 3-carboxy-N-phenylmaleimide, 280 g of CY 175 (trade name, produced by Ciba Geigy Co., alicyclic epoxy resin, epoxy equivalent 133 to 154), 55 g of toluene and 1.5 g of choline chloride, and the reactions were carried out similarly as in Examples 1 to 6.

The photocurable compound obtained had an acid value of 1 mg (KOH)/g. After evaporation of toluene by topping, 100 parts of said compound were mixed uniformly with 4 parts by weight of triphenyl-tert-butylperoxide, 1.0 part by weight of TEAACA and 1.0 part by weight of benzophenone. Subsequently, any one of the conductors shown below was impregnated with this mixture.

(A) Helical coil prepared from a wire subjected to an amideimide treatment (AIW wire, produced by Showa Electric Wire & Cable Co., Ltd., diameter 1 mm);

(B) Helical coil prepared from a wire subjected to an esterimide treatment (EIW wire, produced by Showa Electric Wire & Cable Co., Ltd., diameter 1 mm);

(C) Helical coil prepared from a bare wire with no treatment (KIW wire, produced by Showa Electric Wire & Cable Co., Ltd., diameter, 0.9 mm);

(D) Rotor of 0.75 KW motor (AIW wire produced by Showa Electric Wire & Cable Co., Ltd.); and (E) Aluminum bar wound 4 times with half wraps of glass cloths treated with epoxy silane with a width of 2 cm (100×50×500 mm).

After impregnation of the above conductors with the resin, UV-ray was irradiated on said resin from a distance of 10 cm. As the light source, a 5 KW metal halide lamp (80 W/cm, produced by Toshiba Corporation). Then said resin was cured by heating for a predetermined time.

For the coil type electrical instruments obtained according to the preparation methods as described above, percentages of the resin dripped off were measured. In the case of using a helical coil as the conductor, flexural strength of the coil was measured according to the test method of JIS-C2103-29-3(1977).

The conductors, the preparation conditions and the test results were shown in the Table 6 comprehensively.

For comparison, a coil type electrical instrument was also prepared in the same manner as the above Examples except for using BF3-piperidine complex as the curing catalyst, and the same tests were conducted for this sample. Results are also shown in Table 6 as Control.

TABLE 6

| | Example No. | | | | | |
|---|---|---|---|---|---|---|
| | 23 | 24 | 25 | 26 | 27 | Control |
| Conductor | (A) | (B) | (C) | (D) | (E) | (A) |
| Irradiation time (min.) | 5 | 5 | 5 | 5 | 5 | 5 |
| Heating conditions: | | | | | | |
| Temp. (°C.) | 150 | 150 | 150 | 150 | 150 | 150 |
| Time (hr) | 1 | 1 | 1 | 1 | 1 | 1 |
| Percentage of resin dripped off (%) | 0 | 0 | 0 | 10 | 0 | 80 |
| Flexural strength (Kg) | 6.2 | 7.1 | 5.3 | — | — | 1.7 |

EXAMPLES 28 AND 29

Photocurable compositions F (TEAATi type) and G (TEAACr type) were prepared according to the same procedure as in Examples 23 to 27, except that triethylacetoacetatotitanium (TEAATi) or trisethylacetoacetato-chromium (TEAACr) was employed in place of the organic aluminum (TEAACA). The helical coil subjected to amideimide treatment similarly as in Example 23 was coated with these compositions and evaluated similarly. The results are shown in Table 7.

TABLE 7

| | Example 28 | Example 29 |
|---|---|---|
| Photocurable composition | F | G |
| Conductor | (A) | (A) |
| Irradiation time (min.) | 5 | 5 |
| Heating conditions: | | |
| Temp. (°C.) | 150 | 150 |
| Time (hr) | 3 | 3 |
| Flexural strength (Kg) | 5.8 | 5.1 |

EXAMPLE 30

Resinous compositions were prepared by use of the two kinds of the epoxy compounds as shown in Table 8 and the same aluminum compound and the organic silicon compound, and these were applied on tinplates and irradiated at a distance of 6.5 cm from a metal halide lamp of 80 W/cm to be cured. The curing time was measured to obtain the results shown in the same Table.

TABLE 8

| | Example 30 | Control |
|---|---|---|
| Epoxy compound (100 wt. parts) | (cyclohexyl)-C(=O)-O-CH₂-(cyclohexyl with OH)-O-C(=O)-CH=CH₂ with epoxide | (cyclohexyl)-C(=O)-O-CH₂-(cyclohexyl) with epoxides |
| Aluminum compound (0.5 wt. part) | Tris(acetylacetonato)aluminum | Tris(acetylacetonato)aluminum |
| Organic silicon compound (2 wt. parts) | (C₆H₅)₃Si—O—O—C(CH₃)₃ | (C₆H₅)₃Si—O—O—C(CH₃)₃ |
| Curing time | 3 to 5 sec. | 30 sec. |

We claim:

1. A photocurable composition comprising
   an epoxy compound having at least one epoxy group and at least one unsaturated double bond in the same molecule;
   an organic aluminum compound formulated in an amount ranging from 0.001 to 10% by weight based on the epoxy compound; and
   a silicon compound having a peroxysilano group, which is capable of forming a silanol group when irradiated with light and which is present in an amount ranging from 0.1 to 20% by weight based on the epoxy compound.

2. The photocurable composition according to claim 1, wherein said composition further comprises an epoxy compound having no unsaturated double bond which is present in an amount ranging from 5 to 95% by weight based on the epoxy compound.

3. The photocurable composition according to claim 1, wherein said organic aluminum compound comprises a compound having at least one of an alkoxy group, a phenoxy group, an acyloxy group, and a complex compound comprising a β-diketonato metal complex and an o-carbonylphenolato metal complex and a β-ketoesterato metal complex.

4. The photocurable composition according to claim 1, wherein said metal compound is present is an amount ranging from 0.1 to 5% by weight based on the epoxy compound.

5. The photocurable composition according to claim 1, wherein said silicon compound is a compound represented by the formula:

$$(R^2)_m-\underset{\underset{(R^3)_n}{|}}{\overset{\overset{(R^1)_l}{|}}{Si}}-(O-O-R^4)_{4-(l+m+n)}$$

wherein $R^1$, $R^2$, $R^3$ and $R^4$ are identical or different and each represents a hydrogen atom, a halogen atom, an alkyl group having 1 to 5 carbon atoms, an alkoxy group having 1 to 5 carbon atoms, an aryl group or an aralkyl group; and l, m and n are integers satisfying the conditions of $0 \leq l,m,n, \leq 3$, $1 \leq l+m+n \leq 3$.

6. The photocurable composition according to claim 1, wherein said silicon compound is present in an amount ranging from 1 to 10% by weight based on the epoxy compound.

7. The photocurable composition according to claim 1, wherein a photosensitizer is present in an amount ranging from 0.001 to 10% by weight based on the epoxy compound.

8. The photocurable composition according to claim 1, wherein the curing treatment is conducted by combination of a UV-ray irradiating means and a heating means.

9. The photocurable composition according to claim 1, wherein said epoxy compound is prepared by reacting an unsaturated carboxylic acid with a poly-functional epoxy compound in an organic solvent in the presence of a catalyst.

10. The photocurable composition according to claim 9, wherein said unsaturated carboxylic acid is selected from the group consisting of acrylic acid, methacrylic acid, cinnamic acid, maleic acid and derivatives of these.

11. The photocurable composition according to claim 9, wherein said poly-functional epoxy compound is selected from the group consisting of bisphenol A type epoxy resin, bisphenol F type epoxy resin, phenol-novolac type epoxy resin, alicyclic epoxy resin, epoxy resin containing heterocycic ring, hydrogenated bisphenol A type epoxy resin, aliphatic epoxy resin, glycidyl ester type epoxy resin, spiro ring-containing epoxy resin and glycidyl ether type epoxy resin.

12. A photocurable composition according to claim 1, wherein said epoxy compound has between 2 and 5 epoxy groups, and between 2 and 5 unsaturated double bonds, per molecule.

* * * * *